United States Patent
Binyamini et al.

(10) Patent No.: US 9,715,944 B1
(45) Date of Patent: Jul. 25, 2017

(54) AUTOMATIC BUILT-IN SELF TEST FOR MEMORY ARRAYS

(71) Applicant: International Business Machines Corporation, Armonk, NY (US)

(72) Inventors: Lior Binyamini, Holon (IL); Stefan Payer, Stuttgart (DE); Wolfgang Penth, Holzgerlingen (DE); Ido Rozenberg, Rishon le-Zion (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/183,239

(22) Filed: Jun. 15, 2016

(51) Int. Cl.
*G11C 29/44* (2006.01)
*G11C 11/419* (2006.01)
*G11C 29/12* (2006.01)
*G06F 11/10* (2006.01)
*G11C 29/54* (2006.01)

(52) U.S. Cl.
CPC .......... *G11C 29/44* (2013.01); *G06F 11/106* (2013.01); *G11C 11/419* (2013.01); *G11C 29/12* (2013.01); *G11C 29/54* (2013.01)

(58) Field of Classification Search
CPC ....... G06F 11/106; G11C 29/12; G11C 29/54; G11C 29/44; G11C 11/419
See application file for complete search history.

(56) References Cited

U.S. PATENT DOCUMENTS

| | | | |
|---|---|---|---|
| 7,216,277 B1 * | 5/2007 | Ngai | G11C 29/44 |
| | | | 714/711 |
| 7,257,745 B2 | 8/2007 | Huott et al. | |
| 7,284,166 B2 | 10/2007 | Zappa et al. | |
| 7,793,173 B2 | 9/2010 | Chang et al. | |
| 9,136,019 B1 | 9/2015 | Alves et al. | |
| 2005/0022065 A1 * | 1/2005 | Dixon | G06F 11/106 |
| | | | 714/42 |
| 2007/0079052 A1 * | 4/2007 | Hasegawa | G11C 29/54 |
| | | | 711/100 |
| 2014/0245087 A1 * | 8/2014 | Tokunaga | G11C 29/12 |
| | | | 714/718 |

OTHER PUBLICATIONS

Wang et al., "Global Built-In Self-Repair for 3D Memories with Redundancy Sharing and Parallel Testing", 2011 IEEE ntemational 3D Systems Integration Conference (3DIC), pp. 1-8, DOI: 10.1109/3DIC.2012.6262967, retrieved on Jun. 2, 2016.

* cited by examiner

*Primary Examiner* — Richard Elms
*Assistant Examiner* — Ajay Ojha
(74) *Attorney, Agent, or Firm* — Steven Lee Fisher-Stawinski

(57) ABSTRACT

A memory array includes m·(n+1) memory cells, wherein n and m are natural numbers greater than zero. Each of the plurality of memory cells is connected to one of (n+1) bitlines and one of m wordlines. The memory array further includes n outputs configured for reading a content of the memory array. The memory array further includes n output switches, wherein an i-th output switch is configured for selectively connecting, in response to a switching signal, either an i-th bitline or an (i+1)-th bitline to an i-th output, and wherein i is a natural number and $0 \leq i \leq n-1$. The memory array further includes an (n+1)-th output switch, wherein the (n+1)-th output switch is configured for selectively connecting, in response to the switching signal, either the (n+1)-th bitline or a defined potential to an (n+1)-th output.

4 Claims, 4 Drawing Sheets

AUTOMATIC BUILT-IN SELF TEST FOR MEMORY ARRAYS

BACKGROUND

The present invention generally relates to memory architecture, and more specifically, to memory arrays.

With every new generation of processors, the number and density of memory cells increases. As a consequence, the probability of defective memory cells and/or connections between the memory cells usually increases as well. Memory cells may be organized in memory arrays, wherein each memory cell is connected to a bitline and a wordline.

In order to address the problem of defective memory cells and/or connections to and between the memory cells, redundant bitlines and/or wordlines connected to additional memory cells may be provided. In case a memory cell or interconnection of a certain bitline/wordline is defective, the redundant bitline/wordline may be used instead and the defective bitline/wordline may be ignored. Engineers continue to face challenges in designing usable redundancy systems for memory arrays.

SUMMARY

A memory array includes $m \cdot (n+1)$ memory cells, wherein n and m are natural numbers greater than zero. Each of the plurality of memory cells is connected to one of (n+1) bitlines and one of m wordlines. The memory array further includes n outputs configured for reading a content of the memory array. The memory array further includes n output switches, wherein an i-th output switch is configured for selectively connecting, in response to a switching signal, either an i-th bitline or an (i+1)-th bitline to an i-th output, and wherein i is a natural number and $0 \le i \le n-1$. The memory array further includes an (n+1)-th output switch, wherein the (n+1)-th output switch is configured for selectively connecting, in response to the switching signal, either the (n+1)-th bitline or a defined potential to an (n+1)-th output.

DETAILED DESCRIPTION

Figure 1:
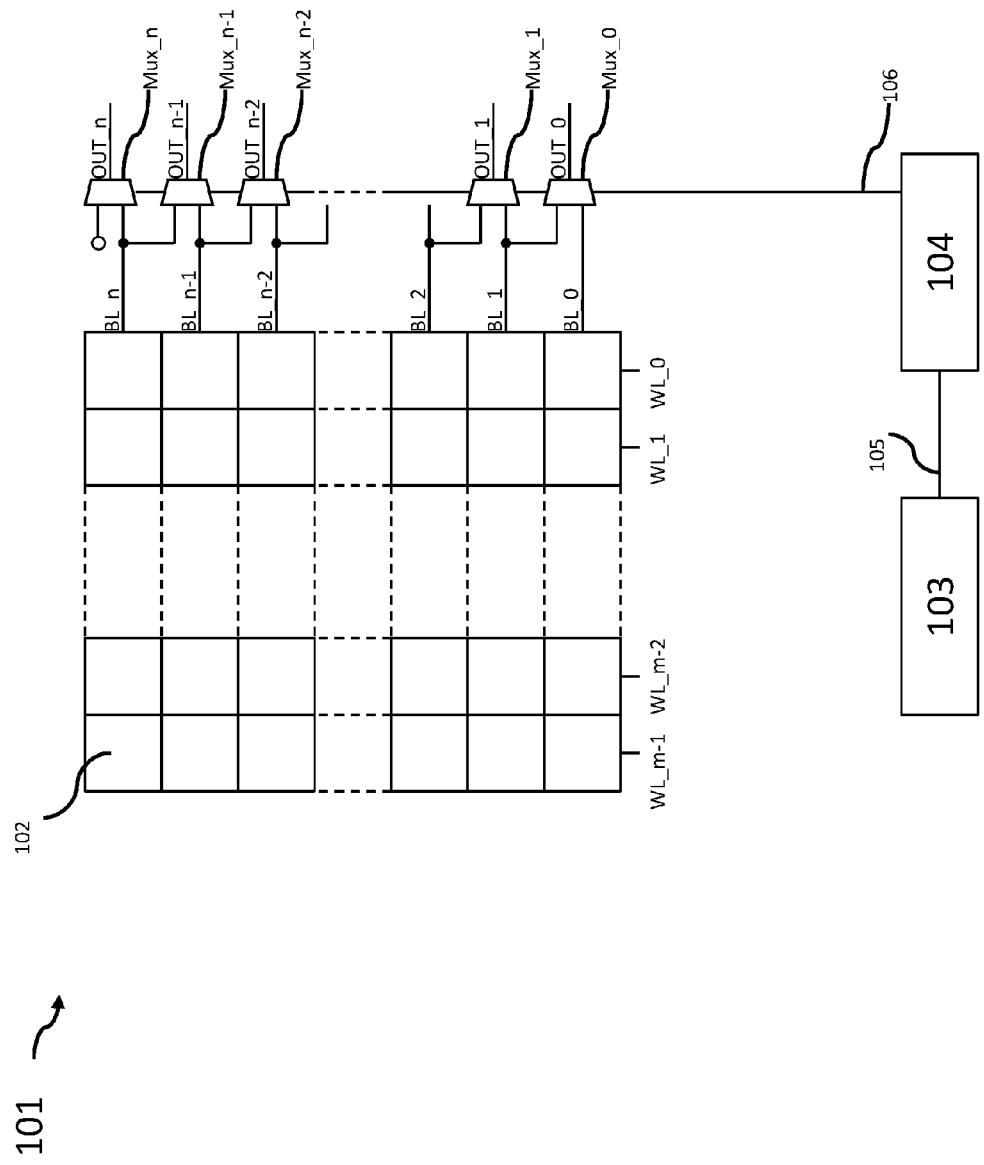
FIG. 1 is a schematic diagram of a first memory array, in accordance with at least one embodiment of the present invention.

Referring now to the invention in more detail, the inventors have observed and/or recognized that, in order to take advantage of redundant bitlines and wordlines, testing of the memory array, including the redundant bitlines, is required to determine the defective bitline/wordline and to ensure that the redundant bitline/wordline replacing the defective bitline/wordline performs properly. However, the inventors have further observed and/or recognized, the costs induced by testing time are quite high, in particular, for high volume products. Typically, a Static random Access Memory (SRAM) array is tested by an Automatic Built-In Self Test (ABIST) engine twice: once for regular data bit testing, and a second time with redundancy enabled. As a result, the test time is typically doubled in case of redundancy. For reliability reasons the redundancy needs to be tested again, also, after burning and other stress scenarios. The extended test time may be attacked by changing the traditional ABIST test flow to add circuits into the SRAM array in order to allow testing with redundancy in parallel to testing the regular SRAM data bits In view of the foregoing, the inventors have identified a need for an improved memory array allowing for a reduced testing time. The need may be addressed with a memory array according to various embodiments of the present invention. In various aspects of the invention, certain advantages may, but need not necessarily, be present: the ABIST test cycle count is reduced at least by a factor of 2 (e.g., 60 mio clock cycles) (ABIST pre-fuse vs. ABIST post-fuse test). For reliability reasons there are potentially multiple test corners for stress reasons which require multiple re-runs with and without the redundancy enabled (in a classic environment).

The inventors have observed various alternatives to using the present invention: (1) Classical testing in two phases: a) test functional bits only b) test again after repair operation has been applied=>that leads to extended test time; and (2) Leaving the exchanged (defective) data out bit open after repair, which implies that the logic afterwards needs to reorder the data out bits in order to get back again to a continuous data out numbering scheme.

According to a first aspect, there is provided a memory array comprising $m \cdot (n+1)$ memory cells, wherein n and m are natural numbers greater than zero, wherein each memory cell (102, 202, 302, 402) is connected to one of (n+1) bitlines and one of m wordlines; n outputs configured for functional reading a content of the memory array; n output switches, wherein the i-th output switch is configured for selectively connecting, in response to a switching signal, either the i-th bitline or the (i+1)-th bitline to the i-th output, and wherein i is a natural number and $0 \le i \le n-1$; wherein the memory array further comprises an (n+1)-th output switch, wherein the (n+1)-th output switch is configured for selectively connecting, in response to the switching signal, either the (n+1)-th bitline (BL_n) or a defined potential to an (n+1)-th output (OUT_n).

Providing an additional (n+1)-th output switch and an additional (n+1)-th output may allow for testing all (n+1)-th bitlines including the redundant n-th bitline without providing the first to (n−1)-th output switches with a switching signal first. This may reduce testing time.

The bitlines may be numbered according to their physical order. However, they may also be numbered in different ways. For example, the lowest bitline may be considered as the first bitline, the topmost bitline may be considered as the second bitline, etc. The numbering of the bitlines need not have any direct resemblance to the physical order at all.

A voltage tie circuit may provide the defined potential. The defined potential may be ground or V_DD. However, the defined potential may also assume a different value.

In an embodiment, the memory array further comprises an input switch, wherein the input switch is configured for connecting, in response to the switching signal, either the (n+1)-th bitline or a defined potential to the n-th output.

The input switch may reduce the amount of test data to be provided to the memory array by one bit.

Another embodiment may provide that the memory array further comprises n input switches, wherein the i-th input switch is configured for connecting, in response to a switching signal, an i-th input to either the i-th bitline or the (i+1)-th bitline; an (n+1)-th input switch, wherein the (n+1)-th input switch is configured for connecting, in response to the switching signal, the (n−1)-th input to either a defined potential or the (n+1)-th bitline.

Providing the input switches may allow for separating the inputs and output of the memory array and facilitate including the memory array in a processor chip.

In another embodiment, the memory array further comprises a defect address register for storing the address of a defective bitline; and a defect address decoder for reading the defect address register and transmitting the switching signal.

Providing a defect address register and a separate defect address decoder may allow for a defect address register requiring only the necessary bit width for indicating the defective bitline and an easy control of the output switches.

According to a further embodiment, the defect address register is a k-bit register; wherein the switching signal has $n=2^k$-bit width.

Moreover, an embodiment may provide that the memory array further comprises a NAND-gate, wherein an output of the NAND-gate is connected to the output switches, wherein a first input of the NAND-gate is connected to the defect address decoder, and wherein a second input of the NAND-gate is connected to an avoid-test-miss signal.

The avoid-test-miss signal and the NAND-gate may allow for testing both bitline connections of the input and both bitline connections of the output switches.

The present invention may be better understood, and its numerous objects, features, and advantages made apparent to those skilled in the art by referencing the accompanying drawings.

FIG. 1 discloses a first memory array 101. The memory array 101 includes memory cells 102. The memory cells 102 are schematically shown to be arranged in m columns and n+1 lines although the physical layout may be different. The memory cells 102 shown in one line are connected to a common bitline $BL\_j$ ($0 \leq j \leq n$). The memory cells 102 of one column are connected to a common wordline $WL\_k$ ($0 \leq k \leq m-1$).

The memory array 101 may store m·n bits, when it is actually used. Accordingly, the memory array comprises n outputs OUT_0 to OUT_n−1 for functional reading. Depending on the design of the memory array 101, the outputs OUT_0 to OUT_n−1 may be used only for functional reading the content in the memory cells 102. In a different design of the memory array 101, the outputs OUT_0 to OUT_n−1 may also be used for functional writing the content in the memory cells 102.

Additional m bits are provided to establish a redundant bitline. In the embodiment shown in FIG. 1 the bitline BL_n may be considered to be the redundant bitline.

The switches Mux_0 to Mux_n−1 allow for connection the outputs OUT_0 to OUT_n−1 for functional reading to the bitlines BL_0 to BL_n. Provided that none of the bitlines BL_0 to BL_n−1 is defective, the switches Mux_0 to Mux_n−1 connect the outputs OUT_0 to OUT_n−1 for functional reading with the bitlines BL_0 to BL_n−1, i.e. to the lower input of the switches Mux_0 to Mux_n−1.

In case testing has revealed that the bitline BL_o ($0 \leq o \leq n-1$), for example the bitline BL_1, is defective, said address of the defective bitline may be stored in a defect address register 103. A defect address decoder 104 may read the address of the defective bitline, which may be stored as an k bit value, and provide the switching signal 106, e.g., an $n=2^k$-bit width switching signal, in order to switch the switches Mux_p ($0 \leq p \leq n-1$), in the example the switches Mux_1 to Mux_n−1, to establish a connection between the outputs OUT_1 with the bitlines BL_p+1, in the example OUT_1 to OUT_n−1, for functional reading and the bitlines BL_2 to BL_n. Thus, the redundant bitline BL_n is used and the defective bitline BL_0, in the example BL_1, ignored.

If only the outputs OUT_0 to OUT_n−1 for functional reading are used for testing the memory array 101, i.e. writing and then reading the content of its memory cells 102, the defect address register has to be rewritten during testing as well in order to test all bitlines, i.e. the ordinary bitlines BL_0 to BL_n−1 and the redundant bitline BL_n, which would consume considerable, expensive testing time.

The memory array 101 comprises an additional output OUT_n for writing and then reading the content of the memory cells 102. A further output switch Mux_n connects the output OUT_n either to the bitline BL_n or to a defined potential.

Reading (and writing) an additional bit during testing may require less effort than rewriting the defect address register 103. Moreover, all bitlines BL_0 to BL_n may be tested irrespective of the content of the defect address register.

Figure 2:
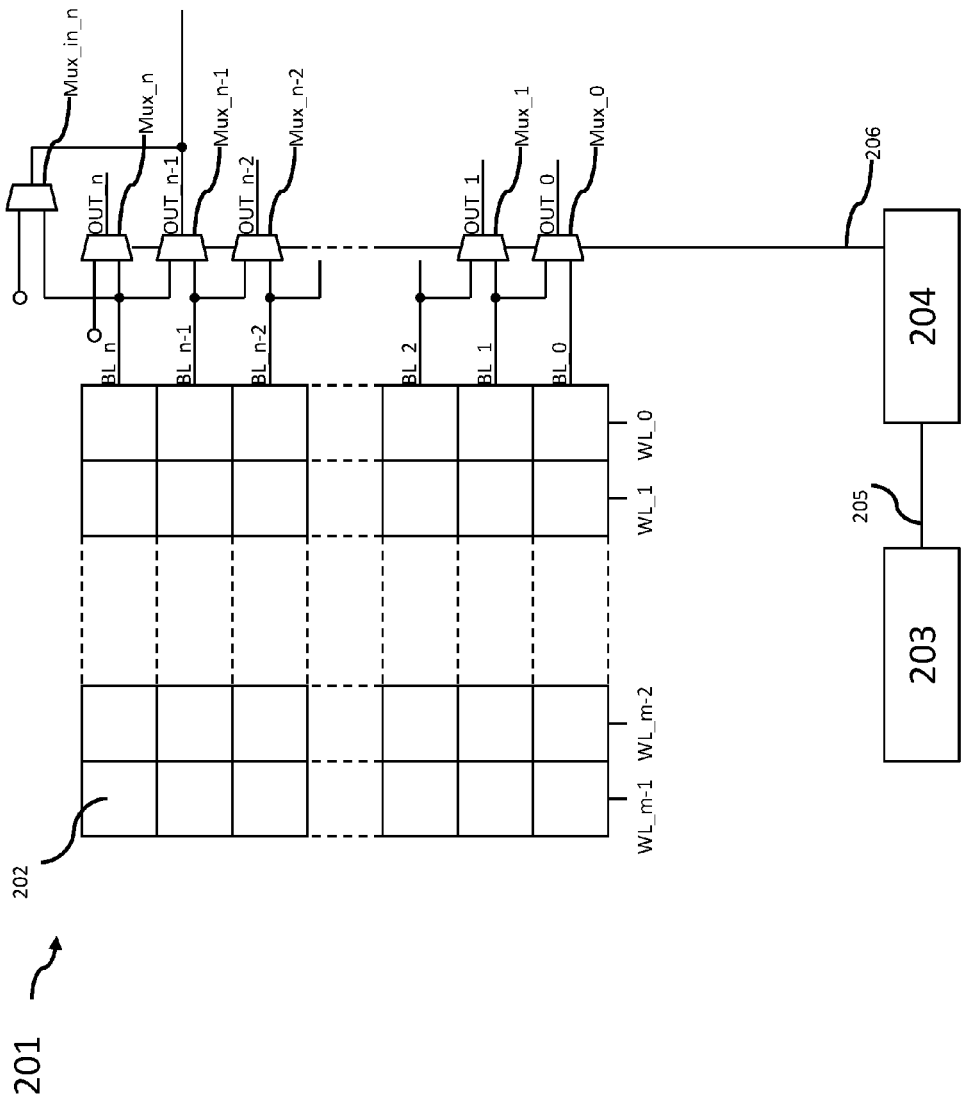
FIG. 2 is a schematic diagram of a second memory array, in accordance with at least one embodiment of the present invention.

FIG. 2 shows a second memory array 201 comprising memory cells 202 connected to bitlines BL_0 to BL_n and wordlines WL_0 to WL_m−1, a defect address register 203, a defect address decoder 204, output switches Mux_0 to Mux_n, and outputs OUT_0 to OUT_n like the first memory array 101. In addition, the second memory array 201 comprises an input switch Mux_in_n which connects the output OUT_n−1 either to the bitline BL_n or a defined potential. During testing of the memory array, the output OUT_n−1 may be used to write test patterns to both the bitline BL_n−1 and the bitline BL_n. Hence, a test pattern having n bits may be sufficient for testing all bitlines. For reading the bitlines during testing, all outputs OUT_0 to OUT_n may be used.

The memory array 101 according to FIG. 1 uses all (n+1) outputs OUT_0 to OUT_n for writing test patterns in the memory cells 102 of the memory array 101. This approach may avoid writing the same content in the neighboring memory cells 102 of the bitlines BL_n−1 and BL_n. Accordingly, a more thorough testing may be achieved.

Figure 3:
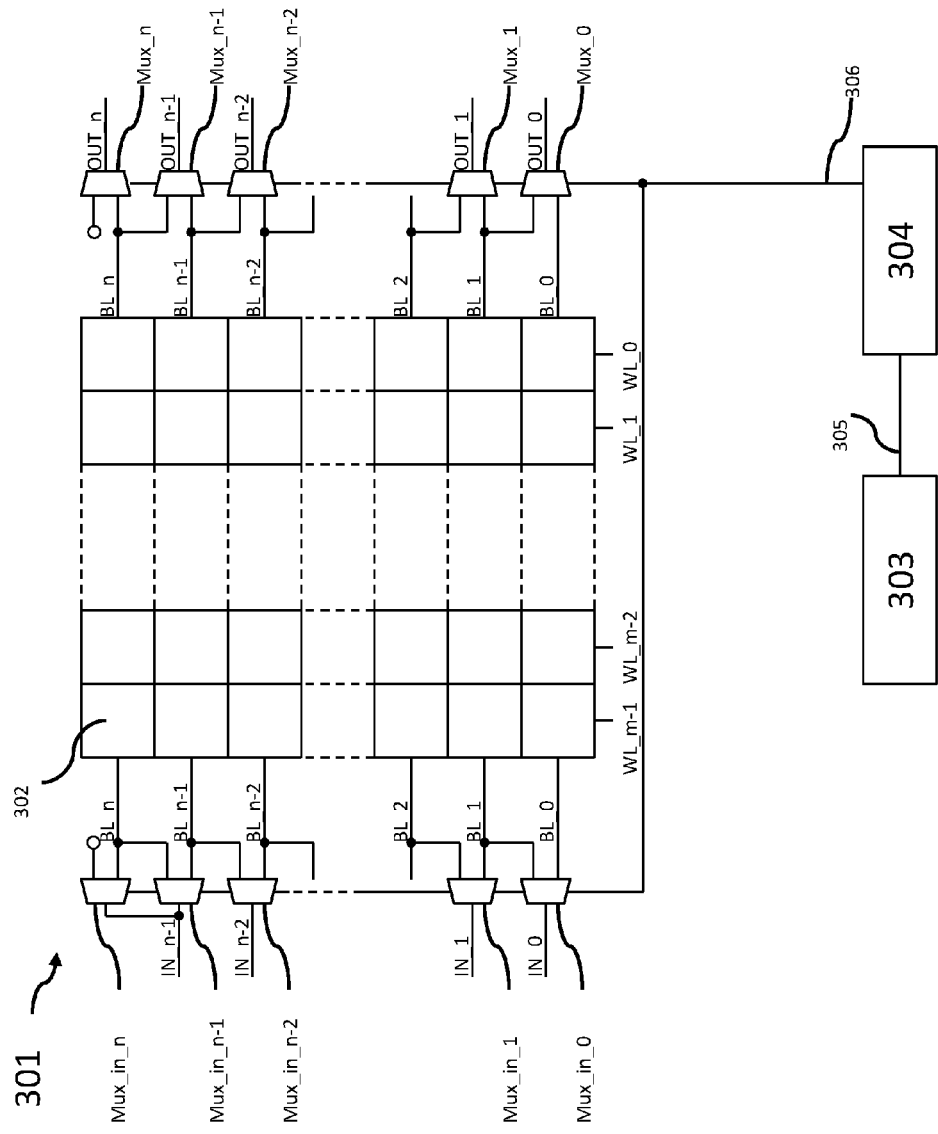
FIG. 3 is a schematic diagram of a third memory array, in accordance with at least one embodiment of the present invention.

FIG. 3 discloses a further, third memory array 301. The third memory array 301 again includes memory cells 302 connected to bitlines BL_0 to BL_n and wordlines WL_0 to WL_m−1, outputs OUT_0 to OUT_n connectable to the bitlines BL_0 to BL_n via output switches Mux_0 to Mux_n. For writing content to the memory cells 302 during testing and operation inputs IN_0 to IN_n−1 are provided. The inputs IN_0 to IN_n−1 may be applied to the bitlines BL_0 to BL_n via input switches Mux_in_0 to Mux_in_n−1 during operation in the same way as the outputs OUT_0 to OUT_n−1 via the switches Mux_0 to Mux_n−1 in response to a switching signal 306 provided by the defect address decoder 304. The defect address 305 may be stored in a defect address register 303 and the defect address decoder 304 may read the defect address 305 from the defect address register 303.

In addition, the memory array 301 comprises an output OUT_n and an output switch Mux_n, which allows for reading all bitlines BL_0 to BL_n during testing irrespective of the defect address 305 stored in the defect address register 303, as has been explained hereinbefore with respect to the memory array 301.

Comparably, the memory array 301 includes an input switch Mux_in_n to allow for writing to all bitlines BL_0 to BL_n during testing irrespective of the defect address 305 stored in the defect address register. The input switch Mux_in_n is connected to the input IN_n−1 in the same way and for the same reasons the input switch Mux_in_n of the memory array 201 has been connected to the output OUT_n.

However, in an alternative embodiment the input switch Mux_in_n may be connected to a separate input IN_n.

Providing inputs IN_0 to IN_n−1 separate from the outputs OUT_0 to OUT_n may facilitate wiring of the memory array 301. Moreover, the separate inputs IN_0 to IN_n−1 may allow for separating writing and reading of the memory cells 302. In particular, each row of the memory array 301 may have separate bitlines for writing and reading the content of the memory cells 302 of that row. This may allow for writing content to a part of the memory cells 302 of the row while reading the content of other memory cells 302 of said row.

Figure 4:
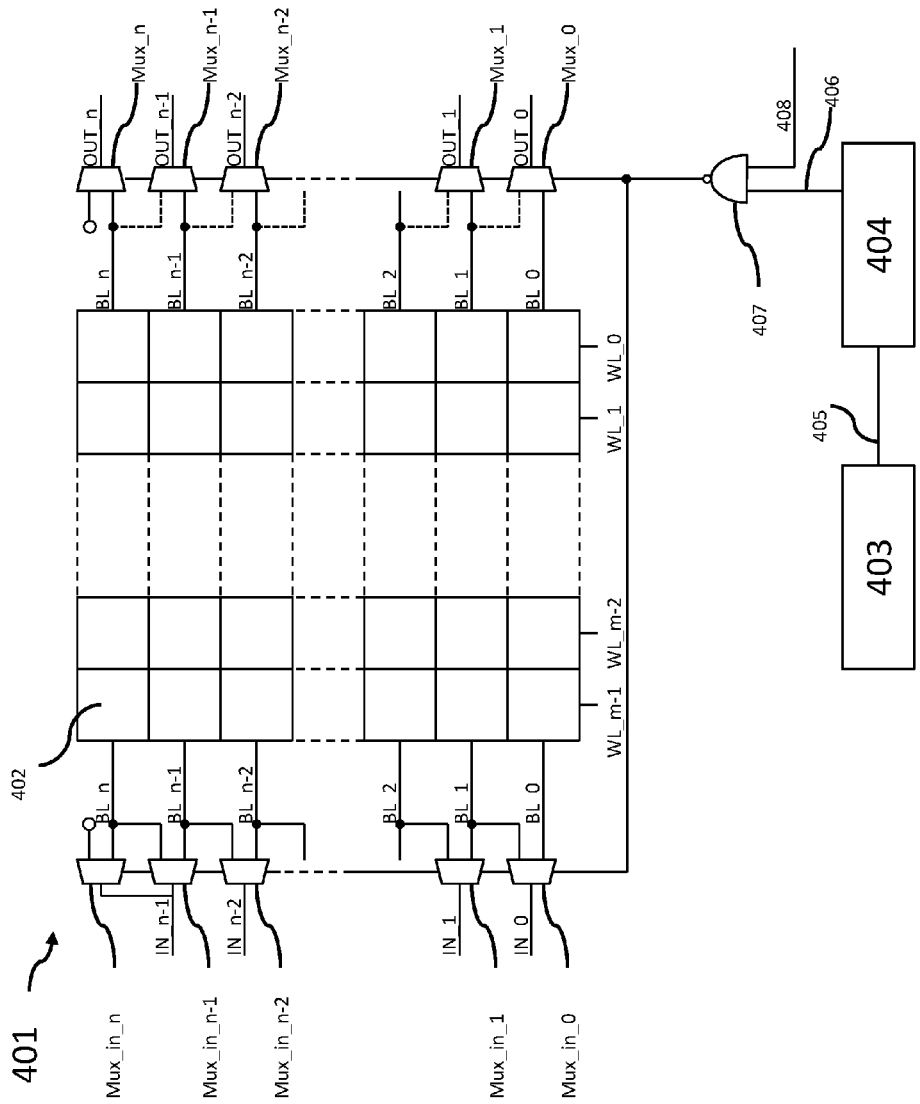
FIG. 4 is a schematic diagram of a fourth memory array, in accordance with at least one embodiment of the present invention.

FIG. 4 shows a fourth memory array 401. Again, the memory array 401 comprises memory cells 402 connected to bitlines BL_0 to BL_n and wordlines WL_0 to WL_m−1, input switches Mux_in_0 to Mux_in_n, output switches Mux_0 to Mux_n, inputs IN_0 to IN_n−1, outputs OUT_0 to OUT_n as well as a defect address register 403 and a defect address decoder 404. As far as their connections and purpose is concerned, referenced is made to the description above.

In addition to the elements of the third memory array 301, the fourth memory array 041 comprises a NAND-gate 407 connected to the output of the defect address converter 404 and an avoid-test-miss signal 408, wherein the NAND-gate 407 provides the switching signal to input switches Mux_in_0 to Mux_in_n and the output switches Mux_0 to Mux_n. Providing the NAND-gate 407 and an avoid-test-miss signal 408 allows for testing not only the physical connection between the output switch Mux_s/input switch Mux_in_s and the bitline BL_s ($0 \le s \le n$) shown as continuous lines in FIG. 4, but also the physical connection between the output switch Mux_t/input switch Mux_t and the bitline BL_t+1 ($0 \le t \le n-1$).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory array comprising:
   m·(n+1) memory cells, wherein n and m are natural numbers greater than zero;
   each of said m·(n+1) memory cells is connected to one of (n+1) bitlines and one of m wordlines;
   n outputs configured for reading a content of said memory array;
   n output switches, wherein an i-th output switch is configured for selectively connecting, in response to a switching signal, either an i-th bitline or an (i+1)-th bitline to an i-th output, and wherein i is a natural number and $0 \le i \le n-1$;
   an (n+1)-th output switch, wherein said (n+1)-th output switch is configured for selectively connecting, in response to said switching signal, either said (n+1)-th bitline or a defined potential to an (n+1)-th output;
   a defect address register configured for storing said address of a defective bitline;
   a defect address decoder configured for reading from said defect address register and transmitting said switching signal;
   a NAND-gate;
   an output of said NAND-gate connected to said n output switches;
   a first input of said NAND-gate connected to said defect address decoder; and
   a second input of said NAND-gate connected to an avoid-test-miss signal.

2. The memory array of claim 1, further comprising an input switch, wherein said input switch is configured for selectively connecting, in response to said switching signal, either said (n+1)-th bitline or a defined potential to a n-th output of said input switch.

3. The memory array of claim 1, further comprising:
   n input switches, wherein an i-th input switch is configured for selectively connecting, in response to a switching signal, an i-th input to either said i-th bitline or said (i+1)-th bitline; and
   an (n+1)-th input switch, wherein said (n+1)-th input switch is configured for selectively connecting, in response to said switching signal, said (n−1)-th input to either a defined potential or said (n+1)-th bitline.

4. The memory array of claim 1, wherein:
   said defect address register is a k-bit register; and
   said switching signal has $n=2^k$-bit width.

* * * * *